United States Patent [19]

Sanjurjo

[11] Patent Number: 5,006,317
[45] Date of Patent: Apr. 9, 1991

[54] PROCESS FOR PRODUCING CRYSTALLINE SILICON INGOT IN A FLUIDIZED BED REACTOR

[75] Inventor: Angel Sanjurjo, San Jose, Calif.

[73] Assignee: CommTech Development Partners II, Menlo Park, Calif.

[21] Appl. No.: 525,900

[22] Filed: May 18, 1990

[51] Int. Cl.⁵ ............................................. B01J 8/42
[52] U.S. Cl. ................................ 422/245; 422/139; 422/140; 422/146; 422/198; 156/615; 156/617.1; 156/620.4
[58] Field of Search ............... 422/139, 140, 146, 198, 422/199, 245, 247; 156/615, 617.1, 620.4

[56] References Cited

U.S. PATENT DOCUMENTS

| | | | |
|---|---|---|---|
| 3,288,567 | 11/1966 | Graham | 422/147 |
| 3,976,430 | 8/1976 | Houston et al. | 422/245 |
| 4,207,360 | 6/1980 | Padovari | 156/613 |
| 4,314,525 | 2/1982 | Hsu et al. | 422/198 |
| 4,786,477 | 11/1988 | Yoon et al. | 422/199 |
| 4,818,495 | 4/1989 | Iya | 422/146 |

FOREIGN PATENT DOCUMENTS 0039039  7/1960  Japan .................................. 422/245

Primary Examiner—Olik Chaudhuri
Assistant Examiner—Felisa Garrett-Meza
Attorney, Agent, or Firm—Irell & Manella

[57] ABSTRACT

Crystalline silicon ingots are produced directly from an internally heated bed of silicon particles.

20 Claims, 1 Drawing Sheet

PROCESS FOR PRODUCING CRYSTALLINE SILICON INGOT IN A FLUIDIZED BED REACTOR

FIELD OF THE INVENTION

This invention relates to the preparation of high-quality crystalline silicon suitable for use in semiconductor manufacture.

BACKGROUND OF THE INVENTION

Most semiconductor devices in use today are based on silicon substrates. As the scale of semiconductor devices progresses toward smaller and smaller dimension, the constraints on the materials used becomes increasingly critical. As semiconductor devices are generally constructed by depositing crystalline layers on a substrate, minute imperfections in the substrate crystal may be amplified with subsequent layer deposition, and may lead to gross error in the device structure. In the case of very large scale integrated circuits (VSLI) such as microprocessor chips, such errors may render the resulting chip unusable. Thus, production of monocrystalline silicon substrate wafers is essential to the industry. The substrate wafers must be essentially free of impurities and crystal defects.

Most of the electronics grade polycrystalline silicon currently used is produced by the Siemens process. A chlorosilane-hydrogen gas mixture is passed over a hot silicon filament, where elemental silicon deposits to form an ingot of polycrystalline Si. In a variation of this process, the chlorosilane is first decomposed to silane (SiH$_4$) before contact with the filament. In another process, SiF$_4$ is converted into SiH$_4$, which is then decomposed to Si in a fluidized bed reactor, or directly reduced with sodium metal. The polycrystalline product is then melted and slowly recrystallized to form a monocrystalline product.

However, filament-based processes are inherently limited in efficiency. These are batch processes, and require nonproductive heating and cooling periods while the reactor is loaded and unloaded. Even the best Siemens reactors require 125-180 kW-hr per Kg Si produced. Fluidized bed reactors are generally heated externally, which results in Si deposition on the reactor walls, leading to cracks and degradation of the reactor. Additionally, the need for a separate recrystallization step introduces a further opportunity for contamination.

DISCLOSURE OF THE INVENTION

I have now invented a process capable of producing monocrystalline Si requiring only one process step, in a single reactor, in which a monocrystalline Si crystal is grown from Si provided by a fluidized bed.

Another aspect of the invention is a reactor for producing monocrystalline silicon, comprising a fluidized bed reactor having an rf susceptor and means for positioning a Si seed crystal.

MODES OF CARRYING OUT THE INVENTION

A. Definitions

Figure 1:
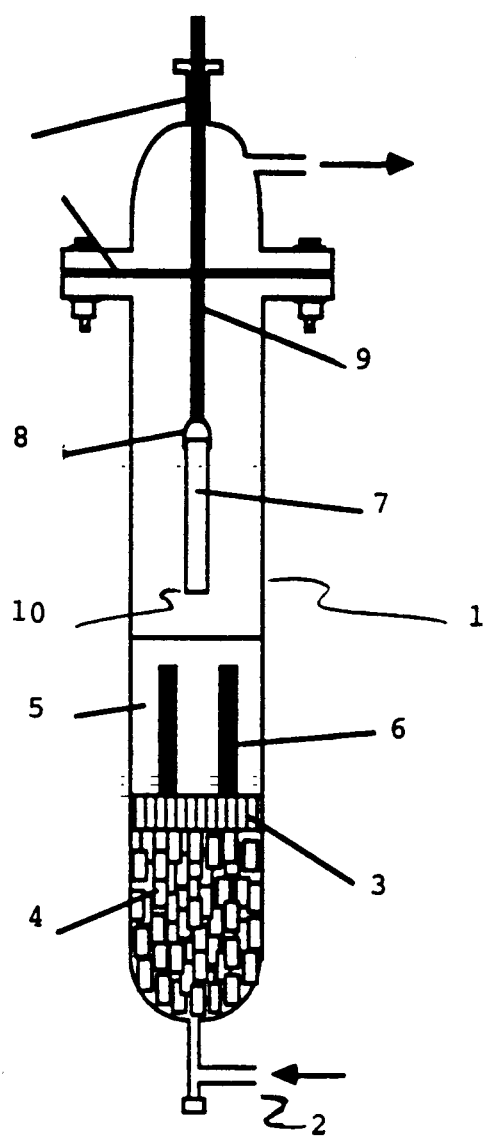
FIG. 1 is a plan view of a fluidized bed reactor of the invention.

The term "highly pure, crystalline silicon" refers to monocrystalline and polycrystalline silicon having a level of purity sufficient for use in semiconductor devices and/or solar cells.

The term "polycrystalline" as used herein indicates a solid having crystalline regions, wherein the crystalline regions have a plurality of different orientations.

The term "monocrystalline" indicates that the solid is a single crystal.

The term "Si particles" or "silicon particles" refer to pieces of solid silicon having a size appropriate to the type of bed employed. For fluidized beds, silicon particles will generally have an average particle size in the range of from about 0.1 $\mu$m to about 5,000 $\mu$m, preferably from about 10 $\mu$m to about 2,000 $\mu$m, and most preferably from about 100 $\mu$m to about 500 $\mu$m.

The term "selective melting" as employed herein is used to indicate that the end of the seed crystal positioned nearest the surface of the silicon particle bed is melted, without melting a substantial portion of the remainder of the seed crystal.

The term "silicon-containing feed gas" refers to a gas which contains silicon in a form which may be decomposed to elemental silicon within the reactor vessel, under the process conditions. Exemplary silicon-containing feed gases include trichlorosilane, silane, disilane, and the like. If desired, one may employ a mixture of gases, such as trichlorosilane and hydrogen, tetrabromosilane and tetrachlorosilane, dichlorosilane and hydrogen chloride, and the like. Presently preferred silicon-containing feed gases are halosilanes, and mixtures of halosilanes with hydrogen.

The term "halosilane" as used herein refers to a compound of silicon with one or more halogens, optionally including hydrogen or other atoms. It is generally preferred to avoid compounds containing oxygen or nitrogen. Presently preferred halosilanes are compounds of the formula SiX$_n$H$_{4-n}$, where each X is independently F, Cl, Br, or I, and n is 1-4. Alternatively, one may use compounds such as hexachlorodisilane, trichlorodibromodisilane, and the like. The most preferred compounds at present are tetrachlorosilane, trichlorosilane, dichlorosilane, tribromosilane, and tetrabromosilane.

The term "linear flow velocity" refers to the speed with which a quantity of gas passes any given point in a flow system, independent of the cross-sectional area of the flow system. The linear flow velocity may be calculated as the volume of gas per unit time divided by the cross-sectional area of the confining vessel at the point at which the velocity is measured.

B. General Method

In the conventional method (the Czochralski process), silicon is melted in a crucible, and allowed to crystalize in contact with a seed crystal. The seed crystal is then slowly raised at the rate of new crystal growth. However, the molten silicon is in contact with the crucible for long periods of time, thus allowing impurity atoms within the crucible walls to leach out into the silicon melt.

In the present invention, silicon is provided in the form of solid pellets. In a fluidized bed, these pellets have a negligible contact area with the reactor walls, and do not melt on contact with the relatively cool walls, and thus do not leach impurities from the vessel. In particular, one may reduce incorporation of oxygen to extremely low levels.

An exemplary device of the invention is depicted in FIG. 1. A suitable reactor vessel 1 is selected to allow crystal growth without contamination. Thus, it is preferred that the vessel be sealable, and that it be lined with a composition which will not contribute impurities to the silicon. It is presently preferred to line the vessel with quartz.

In the presently preferred embodiment, the vessel is provided with a gas inlet 2, and means 3 for distributing the gas, such as a quartz frit. It is also preferred to pack the region of the reactor between the inlet and the gas distribution means with a loose material 4 such as short lengths of quartz tubing, to randomize gas flow and distribute it evenly to the gas distribution means.

A bed of silicon particles 5 is provided on top of the gas distribution means. The size of the particles is selected in concert with the orifices appearing in the gas distribution means to prevent a substantial portion of the particles from falling through. If desired, the silicon bed may be heated, for example using susceptors 6 and an induction coil (not shown). Alternatively, the silicon bed may be heated by preheating the fluidizing gas, by direct heating from an internal source (for example, by resistive heating using elements positioned in place of or near susceptors 6), by irradiation with high-intensity light, and the like. The bed may be operated at any temperature between about 25° C. and the melting point of the silicon particles (about 1410° C.), preferably about 600° C. to about 1400° C., and most preferably about 1100° C. to about 1400° C. The bed may also be provided with an electrode (not shown), to improve control over the heating arc.

A seed crystal 7 is retained within a conductive fitting 8, and supported by a shaft 9. The conductive fitting is preferably tungsten, while the shaft is preferably stainless steel. The vessel is then sealed. In embodiments which include a bed electrode and use an electrical arc to melt the seed crystal, the crystal and the bed electrode should be electrically connected.

In operation, both the seed crystal and the bed are preferably heated by induction using standard induction coils (not shown). The seed crystal and bed are preferably heated by independent means (for example, using two separate induction coil systems), to allow independent control over the bed and seed. Bed 5 is then fluidized with an appropriate gas, and crystal 7 is lowered until the proximal end 10 is within a few centimeters of the top of the fluidized bed. Application of sufficient radio-frequency power will cause an arc to form between the seed crystal and the bed. Alternatively, a voltage may be applied between crystal 7 and bed 5 using a bed electrode, and the voltage increased until an arc appears between the crystal and the bed. The arc will jump stochastically from particle to particle, and thus will not melt individual particles. However, the arc will be continuous at the crystal, and will cause the proximal end 10 to melt.

Silicon particles from the bed occasionally stray far enough vertically to come into contact with the proximal end 10, whereupon they are instantaneously melted and absorbed into the melt. The growing crystal is raised so that the distance between the liquid surface and the upper surface of the bed is maintained essentially constant. It is also preferred to rotate the crystal during growth, as this yields a more even, cylindrical ingot. Machinery suitable for raising the crystal is known in the art: one can employ a standard Czochralski process crystal puller for this purpose. By adjusting the rate at which the crystal is raised, the gas linear flow velocity (and thus the rate at which particles contact the melt), and the input or growth of new particles, one can obtain polycrystalline or monocrystalline silicon of purity and quality sufficient for use in semiconductor devices.

If desired, one may adjust the arc voltage and gas pressure so that a plasma is obtained, which is also suitable for melting the proximal end. Alternatively, one may replace the arc source with other means for heating the proximal end of the crystal. For example, one may provide a set of induction coils which generate a field sufficient to selectively melt the end of the crystal. If desired, one may design the induction coils to produce a field which additionally provides a degree of support for the liquid portion of the crystal end by shaping the meniscus. Alternatively, one may heat the end selectively using a high intensity light source, such as, for example a laser focused on the proximal end. In general, any means for heating the crystal will be suitable if it is capable of establishing the appropriate thermal gradient for crystal growth and melting the proximal end. The precise thermal gradient of greatest utility will closely resemble that of the Czochralski or silicon zone refining techniques, and is obtainable from the art.

In a presently preferred embodiment, the gas used for fluidization is a silicon-containing feed gas, which is capable of depositing elemental silicon on the silicon particles within the bed. Thus, by carefully adjusting the silicon content of the feed gas and the rate at which it is supplied, one can maintain the content of the bed at a constant content. The feed gas may be any suitable decomposable silane derivative, particularly a halosilane, generally in combination with an inert carrier gas. Thus, for example, one may employ $SiHCl_3$ as a silicon-containing feed gas, using $H_2$ as a carrier. The halosilane content may vary from about 0-90%, depending upon the crystal growth rate and the desired bed content. Suitable carrier gases include hydrogen, helium, argon, hydrogen halides, and inert gases which do not react with silicon at the temperatures employed, and which do not contribute impurities. For this reason, it is preferred to avoid carrier gases which include oxygen or nitrogen.

The seed crystal need not be oriented perpendicular to the bed. Alternatively, one may orient an elongated seed crystal parallel to the bed, supported at one or both ends, and grow new crystal in a radial direction from the seed. The seed crystal is slowly rotated in order to provide a uniform ingot. Thus, this embodiment resembles a reverse lathe, in which the workpiece is rotated and slowly gains new material.

In another embodiment of the invention, the lower portion of the reactor may be provided with means for removing larger particles or aggregates of silicon. In a fluidized bed, larger particles will tend to settle towards the bottom of the reactor, where they may be extracted. These particles may then be provided directly to a second reactor, where they may be added to a second Si ingot grown using the method of the invention or by conventional techniques. The second reactor is preferably positioned lower than the first reactor, and the extracted particles supplied to the upper portion of the second reactor. In a presently preferred embodiment of this aspect of the invention, the second reactor is a pedestal crystal growth system.

It is not required that the bed of silicon particles be fluidized in the technical sense of the term. Any agitation which distributes the particles within the reactor, and provides that some of the particles will strike the molten proximal end at a desirable rate, will be sufficient. Thus, one may agitate the particle bed to a state below full fluidization, or may agitate the bed intermittently. One may also employ vibrating beds or mechanically impelled beds, as long as the vibration is sufficiently decoupled from the seed crystal support that is does not affect crystallization. Alternatively, one may employ a fixed bed, and cause particle impact on the proximal end by electrostatic means.

C. EXAMPLES

The examples presented below are provided as a further guide to the practitioner of ordinary skill in the art, and are not to be construed as limiting the invention in any way.

EXAMPLE 1

(A) A reactor vessel with a quartz lining was constructed as depicted in FIG. 1, having a stainless steel support rod and a tungsten coupling to support the seed crystal. The bottom of the vessel was fitted with an inlet valve, a bed of quartz tube sections, and a quartz gas distribution frit. A cylindrical dense graphite susceptor was positioned on the quartz frit, and high purity silicon pellets (1-2 cm) were loaded into the reactor until the susceptor was buried. A 1×1×5 cm seed crystal was cut from a low resistivity N-doped single crystal. The top of the reactor vessel was sealed with O-rings.

The bed was heated to about 1,000° C. by induction. The seed crystal was heated to establish a standard thermal profile by induction using a 7-turn 6 cm copper coil inductor powered by a 10 KW rf power supply. The bed was then fluidized using helium. As the rf power was supplied, a voltage difference developed across the bed and seed crystal. The crystal lowered to within 2 cm of the top of the bed. The voltage was increased until an arc appeared between the seed crystal and the bed, shifting stochastically from particle to particle. The crystal was raised using a single-polarity high-speed motor, at a rate of about 7.2 cm/hr.

The resulting ingot of silicon was irregular and polycrystalline.

(B) The experiment described in part A was repeated, substituting a slower pulling motor. At a pulling speed of <5 cm/hr, the resulting polycrystalline ingot exhibited an improved appearance, with very elongated grains.

(C) The experiment described in part B was repeated, using a configuration capable of rotating the seed crystal during crystal growth. This produced thick, smooth ingots up to 6 cm long.

What is claimed:

1. A device for preparing highly-pure, crystalline silicon, comprising:
   a reactor vessel suitable for containing a plurality of Si particles;
   agitating means for agitating said plurality of Si particles;
   positioning means, for positioning a seed crystal within said reactor; and
   first heating means, capable of melting a portion of a seed crystal positioned by said positioning means.

2. The device of claim 1, wherein said agitating means and said plurality of Si particles together constitute a fixed bed, a pulsed bed, a vibrating bed, a cascade bed, or a fluidized bed.

3. The device of claim 2, which further comprises:
   gas inlet means for directing gas through said plurality of silicon particles.

4. The device of claim 3, wherein said agitating means and said plurality of Si particles constitute a fluidized bed.

5. The device of claim 1, wherein said first heating means comprises:
   an electrode in contact with said plurality of silicon particles;
   connection means, for electrically connecting a seed crystal to said electrode;
   current means, wherein said current means is sufficient to create an electrical arc between a seed crystal positioned in said positioning means and said plurality of Si particles.

6. The device of claim 5, wherein said electrode comprises a silicon-carbide coated graphite electrode within said plurality of Si particles.

7. The device of claim 5, wherein said electrode comprises a conducting ring within said plurality of Si particles.

8. The device of claim 7, which further comprises means for rotating said ring.

9. The device of claim 5, wherein said electrode comprises a plurality of discharge points.

10. The device of claim 1, wherein said first heating means comprises an inductive heating system capable of generating an electrical arc between said seed crystal and said plurality of Si particles.

11. The device of claim 1, wherein said first heating means comprises inductive heating coils positioned outside said reactor vessel.

12. The device of claim 1, wherein said first heating means comprises a microwave source.

13. The device of claim 1, wherein said first heating means comprises a high-intensity light source.

14. The device of claim I, wherein said first heating means comprises a plasma source.

15. The device of claim 1, which further comprises a second heating means, for maintaining said plurality of Si particles at a second predetermined temperature, wherein said second heating means does not directly heat the walls of said reactor vessel.

16. The device of claim 15, wherein said second heating means comprises:
   inductive heating means outside said reactor vessel; and
   a susceptor within said plurality of silicon particles.

17. The device of claim 15, wherein said second heating means comprises:
   a high-intensity light source.

18. The device of claim 15, wherein said second heating means comprises:
   a heated stream of gas directed through said plurality of silicon particles.

19. The device of claim 1, which further comprises:
   means for rotating a seed crystal positioned in said positioning means.

20. A device for preparing highly-pure, crystalline silicon, comprising:
   a reactor vessel suitable for containing a fluidized bed of Si particles;
   gas inlet and direction means for fluidizing said fluidized bed of Si particles;
   positioning means, for positioning a seed crystal within said reactor;
   first heating means, capable of melting a portion of a seed crystal positioned by said positioning means; and
   second heating means, for maintaining said fluidized bed of Si particles at a second predetermined temperature, wherein said second heating means does not directly heat the walls of said reactor vessel.

* * * * *